US007791309B2

(12) United States Patent
Hwang et al.

(10) Patent No.: US 7,791,309 B2
(45) Date of Patent: Sep. 7, 2010

(54) MOTOR CONTROLLER AND METHOD OF CONTROLLING THE MOTOR

(75) Inventors: Sun Ho Hwang, Changwon-si (KR); Han Su Jung, Changwon-si (KR); Chung Hun Lee, Changwon-si (KR)

(73) Assignee: LG Electronics Inc., Seoul (KR)

( * ) Notice: Subject to any disclaimer, the term of this patent is extended or adjusted under 35 U.S.C. 154(b) by 167 days.

(21) Appl. No.: 12/285,949

(22) Filed: Oct. 16, 2008

(65) Prior Publication Data
US 2009/0102412 A1 Apr. 23, 2009

(30) Foreign Application Priority Data
Oct. 18, 2007 (KR) .................... 10-2007-0105159

(51) Int. Cl.
*H02P 27/04* (2006.01)
(52) U.S. Cl. .................... 318/807; 318/767; 318/490; 318/599; 318/800; 318/430; 318/434; 318/436; 361/23; 361/5; 361/93.1; 361/30; 323/274; 323/238; 323/284; 340/657; 340/658; 363/50; 363/56.02; 324/76.39; 324/76.11; 324/72
(58) Field of Classification Search .................... 361/23, 361/5, 93.1, 79.1, 30; 318/490, 599, 800, 318/807, 767, 430, 434, 436; 388/831, 832, 388/804, 805, 812, 908, 912, 928.1; 340/657, 340/658; 363/50, 56.02; 323/274, 238, 284; 324/76.39, 76.11, 72, 160
See application file for complete search history.

(56) References Cited
U.S. PATENT DOCUMENTS 5,003,455 A * 3/1991 Miller .................... 363/87

5,023,527 A * 6/1991 Erdman et al. ......... 318/400.34

(Continued)

FOREIGN PATENT DOCUMENTS
GB 2 281 783 A 3/1995

(Continued)

*Primary Examiner*—Rita Leykin
(74) *Attorney, Agent, or Firm*—McKenna Long & Aldridge LLP

(57) ABSTRACT

The present invention relates a motor controller and a motor control method of controlling a motor having a stator coil and a rotator. The motor controller includes: an activating operator receiving an operation command with a prescribed target frequency while the motor remains stationary, activating the motor at a prescribed voltage and a voltage phase, and then gradually increasing an operation frequency of the motor; an operation exchanger switching an activation operation into a normal operation when the operation frequency reaches a prescribed frequency lower than the target frequency; an evaluator evaluating a location of the rotor included in the motor and the operation frequency based on a current or voltage detected from the motor; a normal operator operating the motor in a normal manner based on the evaluated rotor location; an error determiner determining during the normal operation whether there is an error on the motor based on at least one of the detected current, the detected voltage, and the evaluated operation frequency; and an operation controller enabling the motor to stop in a case where it is determined that there is an error on the motor. The motor controller and the motor control method determine failure of location detection in a sensor-less manner and enable the motor to be stably stopped according to such a determination.

24 Claims, 5 Drawing Sheets

U.S. PATENT DOCUMENTS

| | | | |
|---|---|---|---|
| 5,446,354 A * | 8/1995 | Hiruma | 318/400.21 |
| 5,483,140 A * | 1/1996 | Hess et al. | 318/802 |
| 5,694,010 A * | 12/1997 | Oomura et al. | 318/400.07 |
| 5,834,911 A * | 11/1998 | Kimura | 318/400.11 |
| 5,936,365 A * | 8/1999 | Li et al. | 318/400.24 |
| 5,949,203 A * | 9/1999 | Buthker | 318/400.34 |
| 7,230,397 B2 * | 6/2007 | Nonaka | 318/400.11 |

FOREIGN PATENT DOCUMENTS

| | | |
|---|---|---|
| JP | 03-251098 A | 11/1991 |
| KR | 10-0365619 B1 | 12/2002 |

* cited by examiner

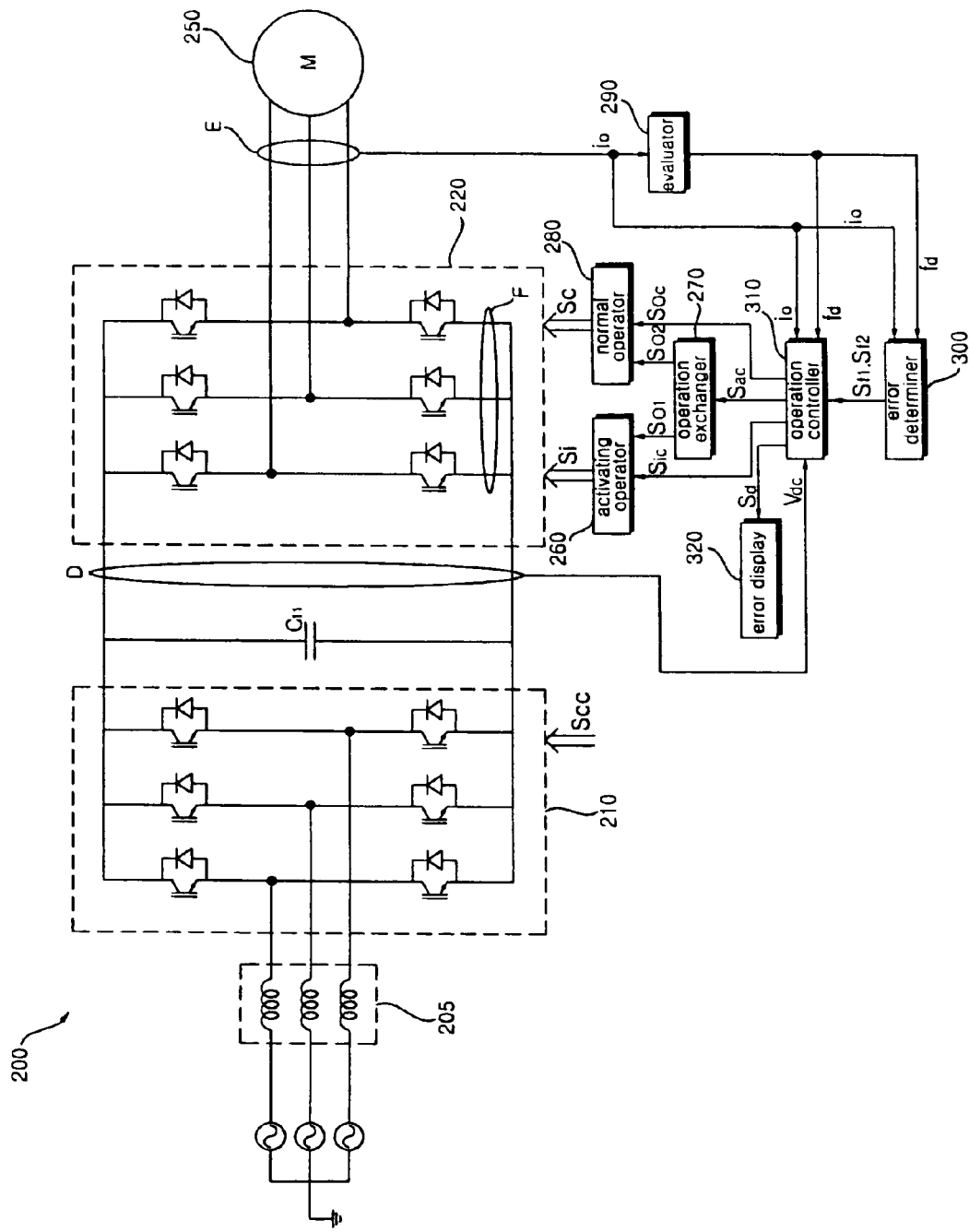
[Figure 1]

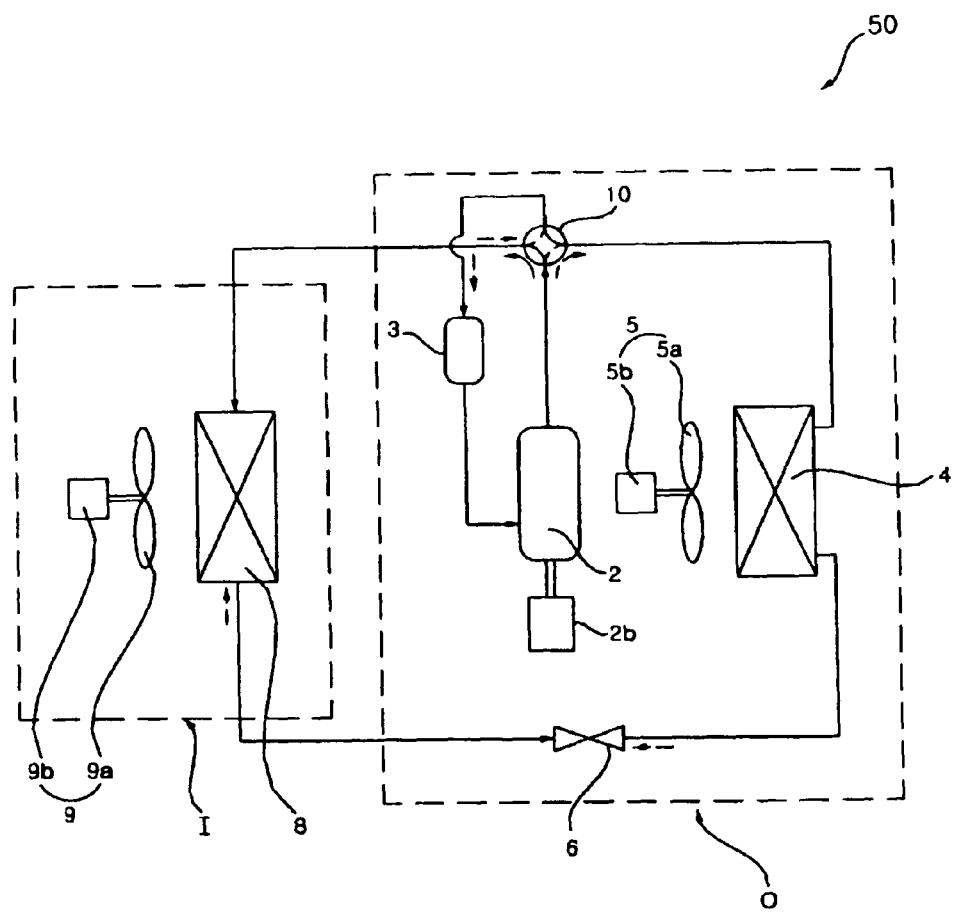
[Figure 2]

[Figure 3]
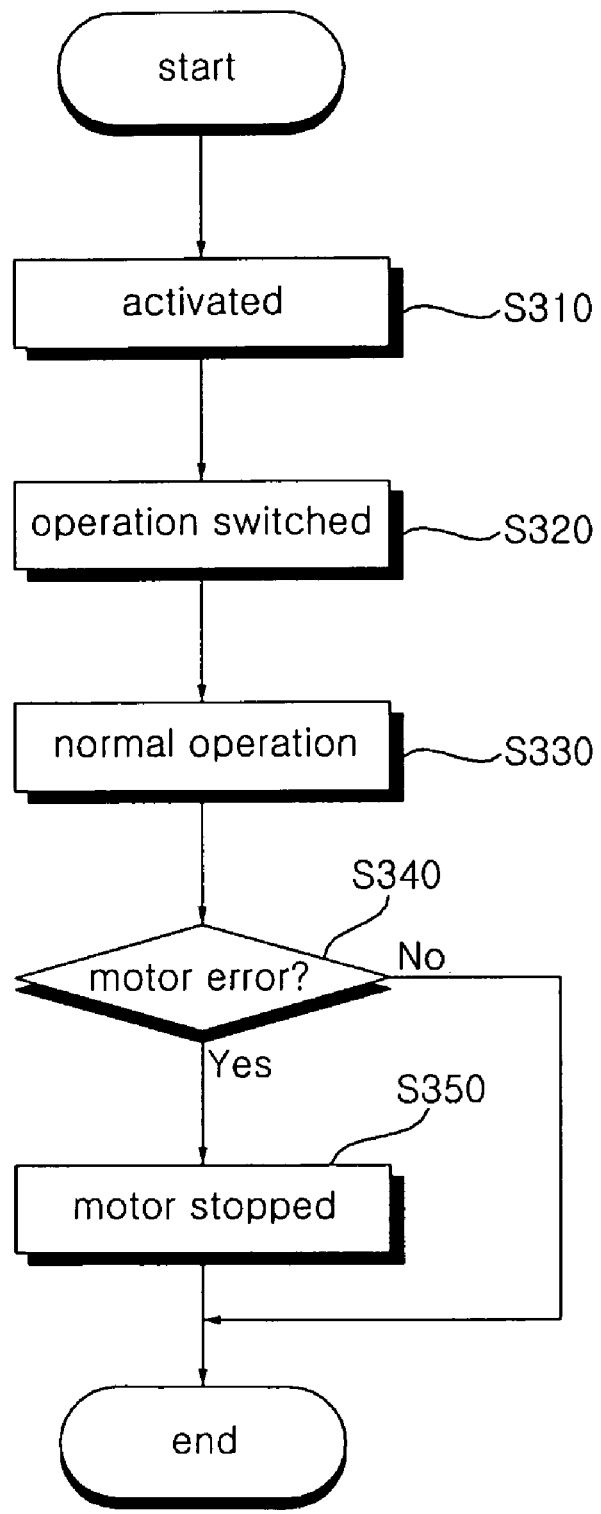

[Figure 4]
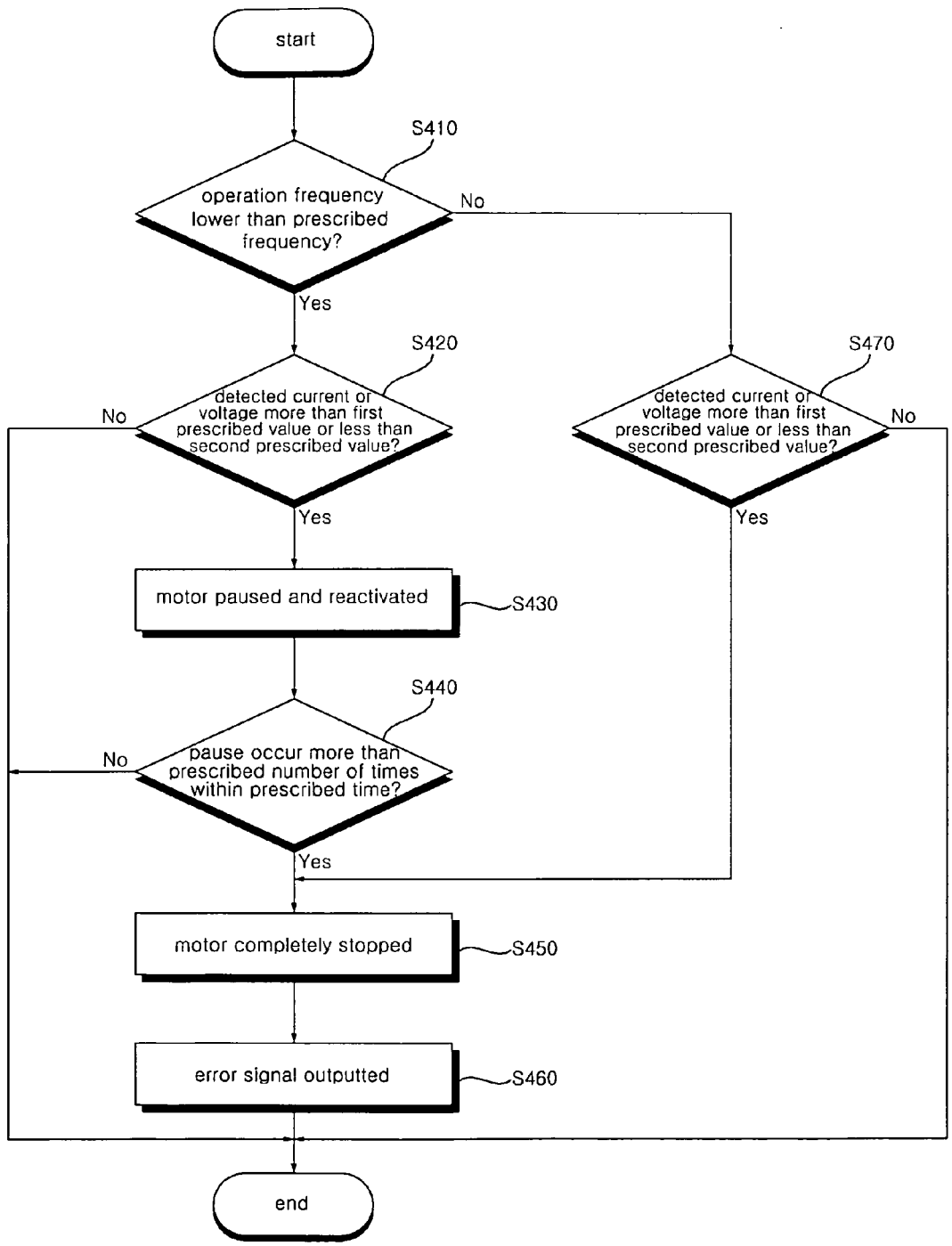

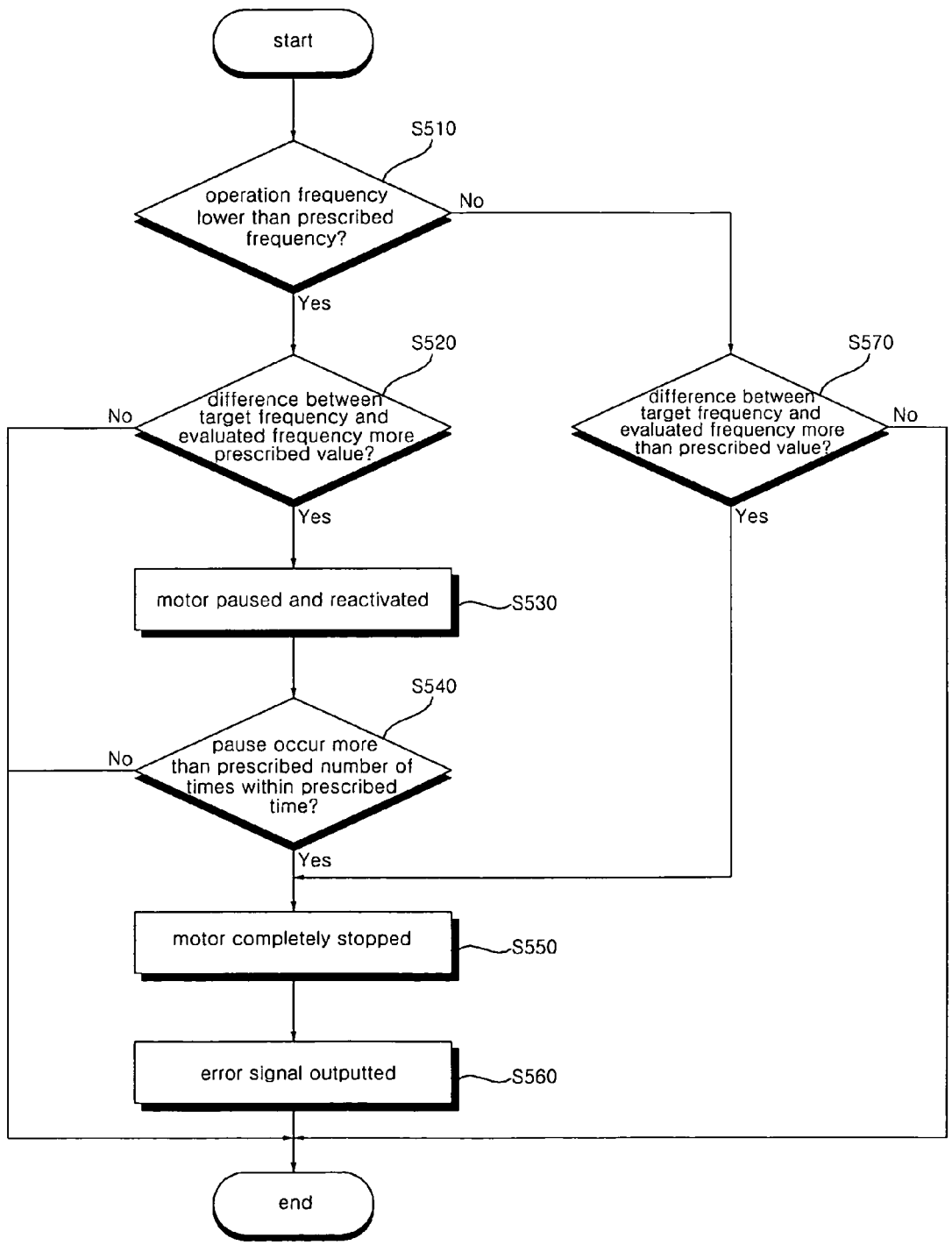
[Figure 5]

MOTOR CONTROLLER AND METHOD OF CONTROLLING THE MOTOR

CROSS-REFERENCE TO RELATED APPLICATION

This application claims the benefit of Korean Patent Application No. 10-2007-0105159, filed on Oct. 18, 2007, which is hereby incorporated by reference in its entirety as if fully set forth herein.

TECHNICAL FIELD

The present invention relates to a motor controller and a motor control method, especially which can stably control a motor by determining failure of location detection in a sensor-less manner, and stopping the motor according to the determination.

BACKGROUND ART

A typical motor controller controls driving of a motor by converting AC utility power into DC power and then converting the DC power into AC power with a prescribed voltage using an inverter.

That is, a conventional motor controller detects a current flowing through the motor by a current sensor mounted inside or outside the motor and controls Ons/Offs of switching elements included in an inverter based on the detected current.

In general, the switching elements included in the inverter are driven by a PWM (Pulse Width Modulation) type switching control signal, and the operations of the motor are controlled to evaluate a target frequency.

Meanwhile, there is also a method of controlling a motor by evaluating a current flowing through the motor in a sensor-less manner in order to save costs.

However, the sensor-less type motor control method fails to provide a specific way to protect the motor upon occurrence of some errors on the motor.

DISCLOSURE

[Technical Problem]

The object of the present invention is to provide a motor controller and a motor control method capable of stably controlling a motor by determining failure of location detection in a sensor-less manner and stopping the motor according to such a determination.

[Technical Solution]

According to an exemplary embodiment of the present invention, a motor controller of controlling a motor having a stator coil and a rotator is provided, including: an activating operator receiving an operation command with a prescribed target frequency while the motor remains stationary, activating the motor at a prescribed voltage and a voltage phase, and then gradually increasing an operation frequency of the motor; an operation exchanger switching an activation operation into a normal operation when the operation frequency reaches a prescribed frequency lower than the target frequency; an evaluator evaluating a location of the rotor included in the motor and the operation frequency based on a current or voltage detected from the motor; a normal operator operating the motor in a normal manner based on the evaluated rotor location; an error determiner determining during the normal operation whether there is an error on the motor based on at least one of the detected current, the detected voltage, and the evaluated operation frequency; and an operation controller enabling the motor to stop in a case where it is determined that there is an error on the motor.

According to an exemplary embodiment of the present invention, a motor control method of controlling a motor having a stator coil and a rotator is provided, including: an activating operation step including receiving an operation command with a prescribed target frequency while the motor remains stationary, activating the motor at a prescribed voltage and a voltage phase, and then gradually increasing an operation frequency of the motor; an operation exchanging step of switching an activation operation into a normal operation when the operation frequency reaches a prescribed frequency lower than the target frequency; a normal operation step of operating the motor in a normal manner based on a location of the rotor evaluated by an evaluator of the motor; an error determining step of determining during the normal operation whether there is an error on the motor based on a current or a voltage detected from the motor, or the evaluated operation frequency; and a stopping step of stopping the motor in a case where it is determined that there is an error on the motor.

[Advantageous Effects]

The motor controller and motor control method according to exemplary embodiments of the present invention may stably control the motor by determining failure of location detection in a sensor-less manner and stopping the motor according to such a determination. In addition, the motor controller and motor control method according to exemplary embodiments of the present invention may suggest a variety of types associated with failure of location detection in the sensor-less manner and therefore control the motor more stably.

DESCRIPTION OF DRAWINGS

FIG. 1 is a circuit diagram illustrating a motor controller according to an exemplary embodiment of the present invention.

FIG. 2 is a view schematically illustrating an air conditioner associated with an exemplary embodiment of the present invention.

FIG. 3 is a flowchart illustrating a method of controlling a motor according to an exemplary embodiment of the present invention.

FIG. 4 is a detailed flowchart illustrating a method of determining whether there is an error and an exemplary pause schematically described with reference to FIG. 3.

FIG. 5 is a detailed flowchart illustrating a method of determining whether there is an error and an exemplary pause schematically described with reference to FIG. 3.

MODE FOR INVENTION

Hereinafter, exemplary embodiments of the present invention will be described in more detail with reference to accompanying drawings.

FIG. 1 is a circuit diagram illustrating a motor controller according to an exemplary embodiment of the present invention.

Referring to FIG. 1, the motor controller 200 includes a reactor 205, a converter 210, a smoothing capacitor C11, an inverter 220, an activating operator 260, an operation exchanger 270, a normal operator 280, an error determiner 300, an evaluator 290, an operation controller 310, and an error display 320. The motor controller 200 may further include a dc terminal voltage detector D and an output current detector E.

Although a three-phase AC power source has been shown as an AC utility power source in FIG. 1, the present invention is not limited thereto. For example, a single-phase AC power source may also be employed as the AC utility power source.

The reactor 205 eliminates harmonic current components from utility AC power and supplies the resultant power to the converter 210. In a case where the converter 210 includes switching elements, the reactor 205 boosts up the utility AC power and supplies the boosted power to the converter 210. In addition, the reactor 205 may correct power factor of the AC power.

The converter 210 converts the AC utility power transmitted from the reactor 205 into DC power. The converter 210 may include plural switching elements for converter, but the present invention is not limited thereto. For example, the converter 210 may be a rectifier that is composed only of diodes. The converter 210 includes total three pairs of switching elements, each pair consisting of an upper switching element and a lower switching element connected in series with the upper switching element, the three pairs connected parallel with each other. Each switching element is connected parallel with a diode. A switching control signal is applied to a gate terminal of each switching element to perform a switching operation.

The smoothing capacitor C11 is connected to an output terminal of the converter 210. The smoothing capacitor C11 serves to smooth the converted DC power outputted from the converter 210. Hereinafter, the output terminal of the converter 210 is referred to as "dc terminal" or "dc link terminal". The smoothed DC power is applied to the inverter 220.

The inverter 220 includes plural switching elements for inverter, receives the smoothed DC power, converts the smoothed DC power into three-phase AC power having a prescribed frequency by Ons/Offs of the switching elements, and applies the three-phase AC power to each terminal of a motor 250. The three-phase motor 250 includes a stator and a rotator, wherein the rotator rotates when AC power is applied to each terminal of the three-phase motor 250 connected to coils wound in the stator. The three-phase motor 250 may include a BLDC motor and a synRM motor. On the other hand, the three-phase motor 250 may be the motor (2b in FIG. 2) used for the compressor included in the air conditioner or the motors (5b and 9b in FIG. 2) used for driving fans.

The activating operator 260 receives an operation command with a prescribed target frequency while the motor 250 remains stationary, activates the motor at a prescribed voltage and a voltage phase, and then gradually increase the operation frequency of the motor 250. That is, the activating operator 260 outputs an activating operation signal Si to the inverter to activate and operate the switching elements included in the inverter, so that the operation frequency of the motor gradually rises up.

The operation command including the target frequency may be received at the activating operator 260, or at the operation controller 310 to be described later.

The operation exchanger 270 generates an operation signal So2 that enables an activating operation to be switched into a normal operation when the operation frequency reaches a prescribed frequency lower than the target frequency. That is, the operation signal So1 is initially outputted to operate the activating operator 260, and then, as the operation frequency reaches a prescribed value, the operation signal So2 is outputted to operate the normal operator 280. Controlling an operation exchanging operation by the operation exchanger 270 may be performed by an operation exchanging control signal Sac generated from the operation controller 310 to be described later.

The normal operator 280 normally operates the motor so that the motor may perform a sensor-less operation. That is, if the evaluator 290 evaluates the location of the rotator and real operation frequency based on a current io detected by a non-sensor type output current detector E or F, then the activating operator 260 outputs the normal operation signal Sc to the inverter 220 based on the evaluated rotator location and real operation frequency in order to operate the motor in a normal manner.

The evaluator 290 evaluates the location of the rotor included in the motor based on the current io detected by the output current detector E or F, or counter-electromotive force generated from the motor. The counter-electromotive force may be detected, for example, by a resistor, and this may be compared with the dc terminal voltage. The evaluator 290 may evaluate the operation frequency fd of the motor, too. The rotor location and operation frequency fd evaluated by the evaluator 290 are applied to the operation controller 310 and the error determiner 300.

In general, the magnitude of the output current io or counter-electromotive force of the motor is small at start-up, and therefore, it could be difficult to detect the output current io or the counter-electromotive force. However, if the output current io or counter-electromotive force increases as the operation frequency gradually rises up, the output current io or counter-electromotive force are inputted to the operation controller 310 and error determiner 300.

The output current io and the counter-electromotive force are used in switching the activating operation into the normal operation, or in determining errors by the error determiner 300 during a normal operation.

The error determiner 300 determines whether or not there are errors on the motor during a normal operation based on the detected output current io or counter-electromotive force or evaluated operation frequency fd.

For example, if the detected output current io or counter-electromotive force is equal to or more than a first prescribed value, or equal to or less than a second prescribed value less than the first prescribed value, wherein the first prescribed value is referred to as an upper limit, and the second prescribed value is referred to as a lower limit, while the operation frequency fd of the motor evaluated by the evaluator 290 is equal to or less than a prescribed frequency, then the error determiner 300 determines it as failure of location evaluation, and outputs a first error determination signal Sf1 to the operation controller 310.

If a difference between the target frequency and the operation frequency fd is equal to or more than a prescribed value while the operation frequency fd is equal to or less than a prescribed frequency, the error determiner 300 determines it as failure of location evaluation, and outputs the first error determination signal Sf1 to the operation controller 310.

For example, if the detected output current io or counter-electromotive force is equal to or more than a first prescribed value, or equal to or less than a second prescribed value less than the first prescribed value, wherein the first prescribed value is referred to as an upper limit, and the second prescribed value is referred to as a lower limit, while the operation frequency fd of the motor evaluated by the evaluator 290 is more than a prescribed frequency, then the error determiner 300 determines it as failure of location evaluation, and outputs a second error determination signal Sf2 to the operation controller 310.

If a difference between the target frequency and the operation frequency fd is equal to or more than a prescribed value while the operation frequency fd is more than a prescribed frequency, the error determiner 300 determines it as failure of location evaluation, and outputs the second error determination signal Sf2 to the operation controller 310.

The prescribed frequency may be 30 Hz. The normal operation frequency gradually rises up to one hundred and several tens of Hz. However, the motor may be paused or stopped according to the failure of location detection at an early frequency-rise section, for example, around 30 Hz, and this allows for initially preventing mal-functions of the motor and improving stability in driving control of the motor.

The operation controller 310 controls operations of the motor based on the error determination signals Sf1 and Sf2 generated from the error determiner 300.

For example, when receiving the first error determination signal Sf1, the operation controller 310 outputs a normal operation control signal Soc to the normal operator 280 so that the motor is paused and then activated. The normal operation control signal Soc enables the normal operator 280 to stop outputting the normal operation signal Sc to the inverter 220. After the lapse of a constant time, the operation controller 310 controls the motor so that the motor that has been paused is reactivated. For this purpose, the operation controller 310 outputs an activating operation control signal Sic to the activating operator 260. The activating operation control signal Sic enables the activating operator 260 to output the activating operation signal Si to the inverter 220.

The operation controller 310 enables the motor to stop all the operations in a case where the motor is paused more than a prescribed number of times within a prescribed time. For this purpose, the operation controller 310 may include a timer and a counter. In a case where the motor is paused more than a prescribed number of times within a prescribed time, the operation controller 310 stops outputting the activating operation control signal Sic and normal operation control signal Soc to the activating operator 260 and normal operator 280, respectively. Accordingly, neither the activating operation signal Si nor normal operation signal Sc is applied to the inverter 220, and this may bring the motor 250 into complete rest.

When the motor 250 completely stops, the operation controller 310 outputs an error signal Sd to the error display 320. The error is displayed on the error display 320 that is composed of display elements such as LEDs.

When receiving the second error determination signal Sf2, the operation controller 310 stops outputting the activating operation control signal Sic and normal operation control signal Soc to the activating operator 260 and normal operator 280, respectively, in order to completely stop the motor. Accordingly, neither the activating operation signal Si nor normal operation signal Sc is applied to the inverter 220, and this may bring the motor 250 into complete rest. When the motor 250 completely stops, the operation controller 310 outputs an error signal Sd to the error display 320. The error is displayed on the error display 320 that is composed of display elements such as LEDs.

The operation controller 310 outputs an operation exchanging control signal Sac to the operation exchanger 270 in connection with switching the activating operation into the normal operation. More specifically, the operation controller 310 outputs an operation exchanging control signal Sac to the operation exchanger 270, wherein the operation exchanging control signal Sac enables the activating operation to be switched into the normal operation when the operation frequency fd reaches a prescribed frequency less than the target frequency. Accordingly, the operation exchanger 270 may switch the activating operation into the normal operation.

In addition, the controller 310 may output a switching control signal Scc for controlling the converter 210. The switching control signal Scc is a switching control signal for PWM, and this switching control signal Scc is generated based on a voltage Vdc detected at dc terminal, and outputted to the converter 210. If the switching control signal Scc is inputted to the gate terminal of each switching element included in the converter 210, each switching element performs a switching operation. Accordingly, power factor may be controlled, and the AC utility power is converted into DC power.

The operation controller 310 may further include a current command generator, a voltage command generator, and a switching control signal output unit. The current command generator generates a current command based on the detected dc terminal voltage and a dc voltage command. The voltage command generator generates a voltage command based on the current command and detected input current. The switching control signal output unit generates a switching control signal Scc to drive the switching elements for converter based on the voltage command.

The operation command 310 may further include another current command generator and another voltage command generator. The current command generator generates a current command based on a difference between a speed evaluated from the evaluator 290 and a speed command. The voltage command generator generates a voltage command based on the current command and detected input current. The generated voltage command may be used for generating a normal operation signal in the normal operator 280. This may control Ons/Offs of the switching elements included in the inverter 220.

The dc terminal voltage detector D detects a dc terminal voltage Vdc which is applied across both terminals of the smoothing capacitor. The dc terminal voltage Vdc may be detected, for example, by a resistor, and the detected dc terminal voltage Vdc may be applied to the operation controller 310. The detected dc terminal voltage Vdc is used for generating a switching control signal Scc to drive the switching elements included in the converter.

The output current detector E may be located between the inverter 220 and the motor 250, and the output current detector E may include a current sensor, a current transformer (CT), and a shunt resistor for current detection. The output current detector F may be a shunt resistor one end of which is connected to a common terminal of the three lower switching elements included in the inverter. The detected current is inputted to the evaluator.

The operation controller 310 may further include a counter-electromotive force detector (not shown) that detects a counter-electromotive force. → 주체가 나타나있지 않아 '운전 제어부(310)'를 주체로 하였습니다. 확인바랍니다.The counter-electromotive force may be detected, for example, by a resistor. The detected counter-electromotive force is inputted to the evaluator.

FIG. 2 is a view schematically illustrating an air conditioner associated with an exemplary embodiment of the present invention.

Referring to FIG. 2, the motor controller described above with reference to FIG. 1 may be used for an air conditioner. The air conditioner 50 includes an inner unit I and an outdoor unit O.

The outdoor unit O includes a compressor 2, a first motor 2b for compressor, a heat exchanger 4, an air blower 5, an expander 6, a cooling/heating switching valve 10, and accumulator 3. The compressor 2 compresses coolant. The first motor 2b drives the compressor 2. The heat exchanger 4 dissipates the heat emanating from the compressed coolant.

The air blower 5 includes an outdoor fan 5a located at a side of the heat exchanger 5 to promote the heat dissipation of the coolant and a second motor 5b to rotate the outdoor fan 5a. The expander 6 expands the compressed coolant. The cooling/heating switching valve 10 switches a flow path of the compressed coolant into another. The accumulator 3 stores vaporized coolant for a moment to eliminate moisture and unwanted materials, and supplies the coolant with constant pressure to the compressor 2.

The inner unit I includes an inner heat exchanger 8 and an inner air blower 9. The inner heat exchanger 8 is located indoors to perform cooling/heating. The inner air blower 9 includes an inner fan 9a located in a side of the inner heat exchanger 8 to promote the heat dissipation of the coolant, and a third motor 9b to rotate the inner fan 9a.

There could be provided at least one inner heat exchanger 8. The compressor 2 may be at least one of an inverter compressor and a constant-velocity compressor.

The air conditioner 50 may be configured as a cooler for cooling, or as a heat pump for cooling or heating.

A motor associated with the motor controller according to the exemplary embodiment of the present invention may be the motors 2b, 5b, and 9b for operating the outdoor fan, the compressor, and the inner fan, respectively.

FIG. 3 is a flowchart illustrating a method of controlling a motor according to an exemplary embodiment of the present invention.

Referring to FIG. 3, firstly, the motor that has remained stationary is activated (step S310). An operation command including a prescribed target frequency is received to enable the motor to be operated at a prescribed voltage and a voltage phase, and then an activating operation is performed, so that the operation frequency of the motor gradually rises up. As described above with reference to FIG. 2, the activating operation signal Si is outputted from the activating operator 260 to the inverter 220. Accordingly, the real operation frequency of the motor gradually rises up to the target frequency.

Next, when the operation frequency reaches a prescribed value less than the target frequency, the activating operation is switched into the normal operation (step S320). In step S310, as the real operation frequency of the motor rises and reaches a prescribed value less than the target frequency, the activating operation is switched into the normal operation. The prescribed value refers to a point of time when the output current io detected by the output current detector E or F or counter-electromotive force starts to be properly detected. From then on, the motor starts up a sensor-less driving. As described above with reference to FIG. 2, the operation exchanger 270 enables the normal operator 280 to operate on behalf of the activating operator 260.

Then, the normal operation is performed (step S330). In the normal operation, unlike the activating operation, the location and operation speed (i.e. operation frequency fd) of the rotor included in the motor are evaluated based on the output current io or counter-electromotive force of the motor, and a sensor-less driving is performed based on the rotor location and operation speed. The normal operator is operated based on the rotor location or operation speed to output the normal operation signal Sc to the inverter 220.

Subsequently, it is determined whether or not there is an error on the motor (step S340). The presence or absence of an error on the motor is determined based on the evaluated operation frequency fd, output current io, or counter-electromotive force while the motor operates at a normal operation mode. The determination of the presence or absence of an error may be detailed later with reference to FIGS. 4 and 5.

Next, if it is determined there is some errors on the motor, the motor is paused (step S350). The motor may be temporarily paused or completely stopped. After then, the motor is reactivated. The pause of the motor will be detailed later with reference to FIGS. 4 and 5.

FIG. 4 is a detailed flowchart illustrating a method of determining whether there is an error and an exemplary pause schematically described with reference to FIG. 3.

Referring to FIG. 4, firstly, it is determined whether the operation frequency is equal to or less than a prescribed frequency (step S410). In general, it is determined during an operation whether the operation frequency fd evaluated by the evaluator 290 is equal to or less than a prescribed frequency. The prescribed frequency may be 30 Hz.

In a case where the operation frequency fd is equal to or less than a prescribed frequency, it is determined whether the detected current or detected voltage is equal to or more than a first prescribed value, or equal to or less than a second prescribed value (step S420). That is, it is determined whether the detected output current io or counter-electromotive force of the motor is equal to or more than an upper limit or equal to or less than a lower limit. This is associated with the determination on whether there is an error in the detected current io detected at the output current detector E or F or counter-electromotive force. In a case where the rotor location and operation frequency fd evaluated by the evaluator 290 escape from a proper range, it could be difficult to control the normal operations of the motor. Therefore, it may be determined whether the rotor location and operation frequency fd escape from a proper range or not.

In a case where the detected output io or detected voltage is equal to or more than the first prescribed value or second prescribed value, the motor is paused and then reactivated (step S430). In a case where the detected current io or counter-electromotive force is equal to or more than the upper limit or equal to or less than the lower limit, it is determined as failure of location detection, and the normal operation of the motor is paused in order to prevent mal-functions of the motor. A prescribed time after pause, the motor is reactivated. The motor returns to the activating operation mode when the motor is reactivated.

Next, it is determined whether the motor is paused more than a predetermined number of times within a prescribed time (step S440). If the reactivation-after-pause procedure of the motor in step S430 occurs more than the predetermined number of times within the prescribed time, it is determined whether the control of the motor continues to be unstably performed.

In a case where the motor is paused more than the predetermined number of times within the prescribed time, the motor is brought into complete rest (step S450). This complete stopping of the motor allows for eliminating unstableness in control of the motor. This may be accomplished by completely stopping the inverter 220 from supplying the output current to the motor. Or, this may be also accomplished by stopping supplying of the AC utility power to the motor controller.

Then, the error signal is outputted (step S460). The error signal Sd is applied to the error display 320 to inform a user that the motor has been completely stopped. The error signal Sd may be displayed on the error display 320 to inform a user that the location detection of the motor has failed and therefore the motor has been completely stopped. This may allow the user to easily notice the failure of location detection and complete stop of the motor.

In a case where the operation frequency fd is more than the prescribed frequency, it is determined whether the detected current io or detected voltage is equal to or more than the first prescribed value, or equal to or less than the second prescribed value (step S470). The prescribed frequency may be 30 Hz. It is determined whether the detected output current io or counter-electromotive force is equal to or more than the upper limit or equal to or less than the lower limit while the operation frequency fd of the motor is more than the prescribed frequency.

If the condition suggested in step S470 is satisfied, the motor is completely stopped and the error signal Sd is outputted to inform the user that the motor has been completely stopped. On the contrary to step S430, if it is determined as failure of location detection while the operation frequency is more than the prescribed frequency, the motor is immediately and completely stopped to ensure the safety in control of the motor. The error signal Sd may be displayed on the error display 320 to inform a user that the location detection of the motor has failed and therefore the motor has been completely stopped. This may allow the user to easily notice the failure of location detection and complete stop of the motor.

FIG. 5 is a detailed flowchart illustrating a method of determining whether there is an error and an exemplary pause schematically described with reference to FIG. 3.

Referring to FIG. 5, the overall process of FIG. 5 is similar to that of FIG. 5. More specifically, steps S510, S530, S540, S550, and S560 are identical to those of FIG. 4 corresponding to them.

As a difference between two, however, it is determined whether a difference between the target frequency and the evaluated frequency is equal to or more than a prescribed value in steps S520 and S570. In another exemplary embodiment related to a determination on whether the location detection fails or not, it is determined whether a difference between the target frequency included in the operation command and the frequency fd evaluated by the evaluator 290 is equal to or more than a prescribed value. If the difference is equal to or more than the prescribed value, it is determined as failure of location detection.

If the condition in step S520 is satisfied in a case where the operation frequency is equal to or less than a prescribed frequency, then the motor is paused and then reactivated. The subsequent steps are equal to those of FIG. 4.

If the condition in step S570 is satisfied in a case where the operation frequency is more than the prescribed frequency, then the motor is immediately and completely stopped. And then, an error is displayed.

The prescribed frequency may be 30 Hz as in FIG. 4. The normal operation frequency gradually rises up to one hundred and several tens of Hz. However, the motor may be paused or stopped according to the failure of location detection at an early frequency-rise section, for example, around 30 Hz, and this allows for initially preventing mal-functions of the motor and improving stability in driving control of the motor.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

INDUSTRIAL APPLICABILITY

The motor controller and motor control method according to exemplary embodiments of the present invention may be used to determine failure of location detection in a sensor-less manner and enable the motor to be stably stopped according to such a determination.

The invention claimed is:

1. A motor controller to control a motor having a stator coil and a rotor, the motor controller comprising:
    an activating operator adapted to:
        receive an operation command with a predetermined target frequency while the motor remains stationary,
        activate the motor at a predetermined voltage and a voltage phase, and
        gradually increase, after activating, an operation frequency of the motor;
    an operation exchanger adapted to switch an activation operation into a normal operation when the operation frequency reaches a predetermined frequency, where the predetermined frequency is lower than the predetermined target frequency;
    an evaluator adapted to evaluate a location of the rotor included in the motor and the operation frequency based on a current or voltage detected from the motor;
    a normal operator adapted to operate the motor in a normal manner based on the evaluated rotor location;
    an error determiner adapted to determine, during operation of the motor, whether there is an error on the motor based on at least one of the detected current, the detected voltage, and the evaluated operation frequency; and
    an operation controller adapted to stop the motor upon a determination by the error determiner of an error on the motor.

2. The motor controller of claim 1, wherein:
    if the detected current or voltage is equal to or more than a first predetermined value, or equal to or less than a second predetermined value, where the second predetermined value is less than the first predetermined value, while the evaluated operation frequency is equal to or less than a predetermined frequency, then the error determiner determines that a failure of location evaluation of the motor has occurred, and
    the operation controller pauses the motor according to the failure of location evaluation of the motor, and then reactivates the motor.

3. The motor controller of claim 2, wherein the operation controller completely stops operations of the motor in a case where pausing the motor occurs more than a predetermined number of times within a predetermined time.

4. The motor controller of claim 3, wherein the operation controller generates an error signal when the motor is completely stopped.

5. The motor controller of claim 1, wherein:
    if the detected current or voltage is equal to or more than a first predetermined value, or equal to or less than a second predetermined value, where the second predetermined value is less than the first predetermined value, while the evaluated operation frequency is more than a predetermined frequency, the error determiner determines that a failure of location evaluation of the motor has occurred, and
    the operation controller completely stops the motor according to the failure of location evaluation of the motor.

6. The motor controller of claim 1, wherein:
    if a difference between the predetermined target frequency and the evaluated frequency is equal to or more than a predetermined value while the evaluated operation frequency is equal to or less than a predetermined frequency, the error determiner determines that a failure of speed evaluation of the motor has occurred, and the operation controller pauses the motor according to the failure of speed evaluation of the motor, and then reactivates the motor.

7. The motor controller of claim 6, wherein the operation controller completely stops operations of the motor in a case where pausing the motor occurs more than a predetermined number of times within a predetermined time.

8. The motor controller of claim 7, wherein the operation controller generates an error signal when the motor is completely stopped.

9. The motor controller of claim 1, wherein if a difference between the predetermined target frequency and the evaluated frequency is equal to or more than a predetermined value while the evaluated operation frequency is more than a predetermined frequency, the error determiner determines that a failure of speed evaluation of the motor has occurred, and the operation controller completely stops the motor according to the failure of speed evaluation of the motor.

10. The motor controller of claim 1, wherein the detected current is an output current flowing through the motor.

11. The motor controller of claim 1, wherein the detected voltage is a counter-electromotive force generated from the motor.

12. The motor controller of any one of claims 2, 5, 6, and 9, wherein the predetermined frequency is 30 Hz.

13. A method of controlling a motor having a stator coil and a rotor, the motor control method comprising:
    receiving an operation command with a predetermined target frequency while the motor remains stationary;
    activating the motor at a predetermined voltage and a voltage phase, and then gradually increasing an operation frequency of the motor;
    switching an activation operation into a normal operation when the operation frequency reaches a predetermined frequency, where the predetermined frequency is lower than the target frequency;
    operating the motor in a normal manner based on a location of the rotor evaluated by an evaluator of the motor;
    determining, during the normal operation, whether there is an error on the motor based on a current or a voltage detected from the motor, or the evaluated operation frequency; and
    stopping the motor if it is determined that there is an error on the motor.

14. The motor control method of claim 13, further comprising:
    determining a failure of location evaluation of the motor if the detected current or voltage is equal to or more than a first predetermined value, or equal to or less than a second predetermined value, where the second predetermined value is less than the first predetermined value, while the evaluated operation frequency is equal to or less than a predetermined frequency, and
    pausing the motor according to the failure of location evaluation and then reactivating the motor.

15. The motor control method of claim 14, further comprising:
    completely stopping operations of the motor if pausing the motor occurs more than a predetermined number of times within a predetermined time.

16. The motor control method of claim 15, further comprising generating an error signal when the operations of the motor are completely stopped.

17. The motor control method of claim 13, further comprising:
    determining a failure of location evaluation of the motor if the detected current or voltage is equal to or more than a first predetermined value, or equal to or less than a second predetermined value less than the first predetermined value while the evaluated operation frequency is more than a predetermined frequency, and
    completely stopping the motor according to the failure of location evaluation of the motor.

18. The motor control method of claim 13, further comprising:
    determining it as failure of speed evaluation of the motor if a difference between the target frequency and the evaluated frequency is equal to or more than a predetermined value while the evaluated operation frequency is equal to or less than a predetermined frequency, and
    pausing the motor according to the failure of speed evaluation and then reactivating the motor.

19. The motor control method of claim 18, further comprising:
    completely stopping operations of the motor if the pausing of the motor occurs more than a predetermined number of times within a predetermined time.

20. The motor control method of claim 19, further comprising generating an error signal when the operations of the motor are completely stopped.

21. The motor control method of claim 13, further comprising:
    determining it as failure of speed evaluation of the motor if a difference between the target frequency and the evaluated frequency is equal to or more than a predetermined value while the evaluated operation frequency is more than a predetermined frequency, and
    completely stopping the motor according to the failure of speed evaluation of the motor.

22. The motor control method of claim 13, wherein the detected current is an output current flowing through the motor.

23. The motor control method of claim 13, wherein the detected voltage is a counter-electromotive force generated from the motor.

24. The motor controller of any one of claims 14, 17, 18, and 21, wherein the predetermined frequency is 30 Hz.

* * * * *